United States Patent [19]

Kuhlmann

[11] Patent Number: 4,968,634
[45] Date of Patent: Nov. 6, 1990

[54] FABRICATION PROCESS FOR PHOTODIODES RESPONSIVE TO BLUE LIGHT

[75] Inventor: Werner Kuhlmann, Munich, Fed. Rep. of Germany

[73] Assignee: Siemens Aktiengesellschaft, Berlin and Munich, Fed. Rep. of Germany

[21] Appl. No.: 322,750

[22] Filed: Mar. 13, 1989

[30] Foreign Application Priority Data

May 20, 1988 [DE] Fed. Rep. of Germany ....... 3817329

[51] Int. Cl.$^5$ ........................................... H01L 31/18
[52] U.S. Cl. ........................................... 437/3; 437/20
[58] Field of Search ................... 437/3, 20, 27; 357/30

[56] References Cited

U.S. PATENT DOCUMENTS

| 4,104,085 | 8/1978 | Zandveld | 357/91 |
| 4,107,722 | 8/1978 | Chamberlin | 357/30 |
| 4,141,756 | 2/1979 | Chiang et al. | 357/30 |

FOREIGN PATENT DOCUMENTS

| 0149683 | 7/1985 | European Pat. Off. | |
| 2709802 | 9/1978 | Fed. Rep. of Germany | 437/20 |
| 3003391 | 8/1981 | Fed. Rep. of Germany | 437/3 |
| 2131748 | 6/1984 | United Kingdom | |

OTHER PUBLICATIONS

IEEE Trans. on Nuclear Science, vol. NS-29, No. 1, Feb. 1982, pp. 733-737.
Review of Scientific Instr., vol. 51, No. 9, Sep. 1980, pp. 1212-1216.
Nuclear Instr. & Methods in Physics Research, vol. A-235, No. 2, Apr. 1985, pp. 249-253.
Jour. of the Electrochemical Society, vol. 131, No. 1, Jan. 1984, pp. 161-171.

Primary Examiner—Olik Chaudhuri
Assistant Examiner—George R. Fourson
Attorney, Agent, or Firm—Eugene S. Indyk; John F. Moran

[57] ABSTRACT

A method is provided for the fabrication of a photodiode sensitive to blue light. This photodiode has a very flat pn junction (2) in order to achieve a high blue sensitivity. The pn-junction (2) is formed in an n-conducting (100)-oriented silicon monocrystal (1) through implantation of B+ ions. Subsequently, an upper layer (3) generated during the implantation with relatively low p-doping is eroded through anisotropic etching to extend into a region of a deeper lying layer (4) having a relatively high p+-doping. This high p+-doping layer is then located to provide high sensitivity of the silicon photodiodes light corresponding to blue in the visual spectrum.

7 Claims, 1 Drawing Sheet

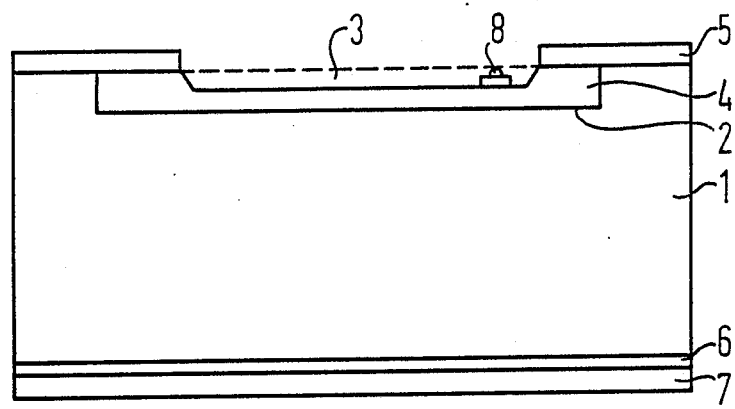

FABRICATION PROCESS FOR PHOTODIODES RESPONSIVE TO BLUE LIGHT

BACKGROUND OF THE INVENTION

The invention relates to a method for fabricating photodiode responsive to blue light.

Silicon photodiodes and, it relates, more particularly, to the fabrication of photodiodes adapted to the highly for the wavelength range of approximately 250 nanometers (nm) to 500 nm must have a very flat pn junction since it is known that the penetration depth of short-wave radiation in the semiconductor crystal is very small. For a wavelength, $\tau = 400$ nm, the penetration depth d is, for example, approximately 0.2 microns ($\mu$).

With the aid of diffusion processes, the problem of realizing very flat pn junctions is very difficult particular with respect to being be reproducibly controlled.

When using ion implantation methods, the formation of very flat dopings is relatively simple. But the fact is that the maximum of the implantation doping concentration does not lie on the surface of the crystal and is somewhat deeper is a disadvantage. The charge carriers freed by the energy of light, therefore encounter a concentration profile which is directed oppositely to their nominal direction of diffusion to the pn junction.

One way of avoiding this is the utilization of a scattering medium in the form of an oxide, nitride, α-silicon etc., with the demands for maintaining the proper thickness of the layer or penetration depth being great.

A further possibility for locating the implantation peak on the semiconductor crystal surface is to etch off the topmost or outer silicon layer. Due to the small thickness and the required uniformity this is not possible with normal etching methods customarily used for removing semiconductor material.

SUMMARY OF THE INVENTION

It is an object of the present invention to avoid the foregoing disadvantages while providing a method for the fabrication of a photodiode having a very flat pn junction so that a high sensitivity to blue light is achieved by the photodiode.

In accordance with the invention, the fabrication of a blue-sensitive photodiode begins with an n-conducting (100)-oriented Simonocrystal having a portion of its surface subjected to an implantation of B+ ions to form a flat abrupt pn junction within the interior of the silicon removed a shallow distance from the surface. Subsequently the exterior layer with relatively low p-doping formed in this process is removed through anisotropic etching to locate the exposed surface in the region of the deeper lying layer with relatively high p+-doping.

In the process, the oxide layer functions a mask during the ion implantation for the fabrication of the pn junction and is advantageously used in the following anisotropic an etching mask.

For the anisotropic etching, an ethylenediamine-pyrocatechol-water solution is preferably used.

A photodiode with particularly favorable blue-sensitivity characteristic is achieved with the method according to the invention thereby that B+ ions are implanted with an acceleration voltage of approximately 30 keV and a dose of $7*10^{14}$cm$^{-2}$ in the n-conducting silicon monocrystal, and that thereupon the region of generated p-conducting layer, the doping concentration which increases with increasing depth, is etched off anisotropically with an ethylenediamine-water solution to a depth of approximately 0.1$\mu$.

In the fabrication of such a photodiode, the results known to those skilled in the art obtained by anisotropic etching of boron-doped silicon crystals having a specific (100) crystallagraphic orientation are purposefully applied. Such investigation are described, for example, by N.F. Raley, Y. Sugiyama, and T. von Duzer in J. Electrochem. Soc., Vol. 131, No. 1 (Jan. 1984), pages 161 to 171.

The etching rate of ethylenediamine/H$_2$O under certain circumstances depends on the boron doping of the silicon. In the range $<10^{19}$cm$^{-3}$ the etching rate is approximately 1 $\mu$/min, at $10^{20}$cm$^{-3}$ it decreases to 1 nm/min. If for example boron is implanted with 30 keV and a dose of $7*10^{14}$cm$^{-2}$, an N$_{max}$ of $1*10^{20}$cm$-3$ results in a depth of approximately 0.1$\mu$.

If such a semiconductor crystal wafer is etched for a few minutes the region of low doping is eroded, in the region of the peak maximum effectively an etch-stop takes place. The etching depth is so slight that in the following planar technique no problems occur. Ethyleneiamine effectively does not contaminate the wafers. The oxide frame acts as etching mask; from here an angle of slope of approximately 54° is etched to the depth of the peak maximum. The crystal damage of the implantation is partially removed.

However, the difference between implanted dose and electrically active boron must be observed. The activation rate is largely a function of the curing conditions after the ion implantation.

A prerequisite is, of course, use of (100)-oriented silicon which, however, due to the lower of the semiconductor material at the surface density compared to the (111) direction for blue-sensitive photodiodes is of advantage in any case.

BRIEF DESCRIPTION OF THE DRAWING

An illustrative embodiment is depicted by the sole FIGURE. Further objects of the invention as well as features of the invention will become apparent upon reading the detailed description considered in conjunction with the accompanying drawing.

The blue-sensitive photodiode according to the invention illustrated in cross-sectional in the sole FIGURE is fabricated in accordance with the following steps:

In an n-conducting (100)-oriented Si monocrystal 1 which is provided with an oxide mask 5, a flat abrupt pn junction 2 is formed through implantation of B+ ions. Subsequently the layer 3 which originated in the boron ion implantation with relatively low p-doping indicated in the FIGURE by the dashed line is eroded through anisotropic etching into the junction region to the deeper lying layer 4 with relatively high p+-doping. The side walls of the etching groove which in the FIGURE represents the original layer 3 have an angle of slope of approximately 54°. In the anisotropic etching, the oxide layer 5 remaining after the ion implantation is advantageously used as an etching mask so that the fabrication process is simplified. The remaining fabrication steps are carried out in the manner customary in the planar technique. Thus the n-conducting area 1 of the silicon wafer is adjoined by an n+-layer 6 with the metal contact layer 7, and on the opposite side the photodiode is provided on the p+-layer 4 with the second metal contact 8. It is understood, that the side of the incidence of light of the diode, i.e. the p+-layer 4 can still be provided with a (not shown) antireflection layer.

There has thus been shown and described a novel process for fabricating photodiodes especially sensitive to blue light which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. All such changes, modifications, variations and other uses and applications which do not depart from the spirit and scope of the invention are deemed to be covered by the invention which is limited only by the claims which follow.

I claim:

1. A method of fabricating a photodiode responsive to blue light, comprising the steps of:

obtaining an n-conducting (100)-oriented monocrystalline silicon;

implanting B+ ions in a surface of the silicon so as to form a flat abrupt pn-junction in the silicon beneath the surface into which $B^{30}$ ions have been implanted, thereby forming a p-doped zone between the surface and the pn junction, the zone having a layer of relatively low p-doping near the surface and a layer of relatively higher p+ doping near the pn-junction; and eroding away the layer of relatively low p-doping via anistropic etching.

2. A method as stated in claim 1, further comprising the step of using an oxide layer as mask in the step of ion implantation for the fabrication of the pn-junction and as an etching mask in the step of eroding via anisotropic etching.

3. A method according to claim 2, wherein the step of eroding via anisotropic etching means uses an ethylenediamine-pyrocatechol-water solution.

4. A method according to claim 2, wherein the B+ ions are implanted in the n-conducting silicon monocrystal using an acceleration voltage of approximately 30 keV and a dose of $7*10^{14} cm^{-2}$ and an outer portion of the p-doped zone is etched off anisotropically using an ethylenediamine-water solution to a depth of approximately $0.1\mu$.

5. A method according to claim 2, wherein the B+ ions are implanted in the n-conducting silicon monocrystal using an acceleration voltage of approximately 30 keV and a dose of $7*10^{14} cm^{-2}$ and an outer portion of the p-doped zone is etched off anisotropically using an ethylenediamine-water solution to a depth of approximately $0.1\mu$.

6. A method according to claim 1, wherein the step of eroding via anisotropic etching uses an ethylenediamine-pyrocatechol-water solution.

7. A method according to claim 1, wherein the B+ ions are implanted in the n-conducting silicon monocrystal using an acceleration voltage of approximately 30 keV and a dose of $7*10^{14} cm^{-2}$ and an outer portion of the p-doped zone is etched off anisotropically using an ethylenediamine-water solution to a depth of approximately $0.1\mu$.

* * * * *